(12) United States Patent
Jo et al.

(10) Patent No.: US 12,433,076 B2
(45) Date of Patent: Sep. 30, 2025

(54) LIGHT-EMITTING DEVICE PACKAGE FOR BACK LIGHT AND MANUFACTURING METHOD THEREOF

(71) Applicant: LUMENS CO., LTD., Yongin-si (KR)

(72) Inventors: Sung Sik Jo, Yongin-si (KR); Pyeong Guk Kim, Yongin-si (KR)

(73) Assignee: LUMENS CO., LTD., Yongin-si (KR)

(*) Notice: Subject to any disclaimer, the term of this patent is extended or adjusted under 35 U.S.C. 154(b) by 603 days.

(21) Appl. No.: 17/721,052

(22) Filed: Apr. 14, 2022

(65) Prior Publication Data
US 2022/0344553 A1 Oct. 27, 2022

(30) Foreign Application Priority Data
Apr. 22, 2021 (KR) ............ 10-2021-0052388

(51) Int. Cl.
*H10H 20/856* (2025.01)
*H10H 20/01* (2025.01)
*H10H 20/851* (2025.01)

(52) U.S. Cl.
CPC ........ *H10H 20/856* (2025.01); *H10H 20/851* (2025.01); *H10H 20/0361* (2025.01); *H10H 20/0363* (2025.01)

(58) Field of Classification Search
CPC ..... H01L 2933/0058; H01L 2933/0041; H01L 33/60; H01L 33/508; H10H 20/0363; H10H 20/856; H10H 20/0361
See application file for complete search history.

(56) References Cited

U.S. PATENT DOCUMENTS

| 2017/0309793 A1 | 10/2017 | Seo et al. | |
| 2018/0151785 A1* | 5/2018 | Hashimoto | H10H 20/853 |
| 2019/0067537 A1* | 2/2019 | Hayashi | H10H 20/856 |

(Continued)

FOREIGN PATENT DOCUMENTS

| JP | 2019-41009 A | 3/2019 |
| JP | 2019-212931 A | 12/2019 |
| KR | 10-2020-0019514 A | 2/2020 |

OTHER PUBLICATIONS

Extended European Search Report mailed by European Patent Office on Sep. 22, 2022 in European Patent Application No. 22167849.3.

(Continued)

*Primary Examiner* — Samuel A Gebremariam
*Assistant Examiner* — Jonas T Beardsley
(74) *Attorney, Agent, or Firm* — Mei & Mark LLP

(57) ABSTRACT

A light-emitting device package includes an LED chip including a substrate having an upper surface, a semiconductor laminate structure formed under the substrate, and a first conductive connection pad and a second conductive connection pad formed under the semiconductor laminate structure, a wavelength conversion member having one surface in contact with the upper surface of the substrate, a light transmitting member covering a side surface of the LED chip and one surface of the wavelength conversion member adjacent to the side surface, and a reflector including at least one first region covering a side surface of the wavelength conversion member and the light transmitting member, and at least one second region covering the light transmitting member and exposing the side surface of the wavelength conversion member.

13 Claims, 5 Drawing Sheets

(56) References Cited

U.S. PATENT DOCUMENTS

2019/0165226 A1* 5/2019 Kim .................... H10H 20/825
2019/0319176 A1   10/2019 Sato
2020/0127171 A1*  4/2020 Tong ................. H10H 20/8515

OTHER PUBLICATIONS

Office Action issued by Korean Intellectual Property Office mailed on Nov. 18, 2022 in Korean Patent Application No. 10-2021-0052388.

Final Office Action issued by Korean Intellectual Property Office mailed on Mar. 19, 2023 in Korean Patent Application No. 10-2021-0052388.

\* cited by examiner

LIGHT-EMITTING DEVICE PACKAGE FOR BACK LIGHT AND MANUFACTURING METHOD THEREOF

CROSS-REFERENCE TO RELATED APPLICATION

This application claims the benefit of Korean Patent Application No. 10-2021-0052388, filed on Apr. 22, 2021, in the Korean Intellectual Property Office, the disclosure of which is incorporated herein in its entirety by reference.

BACKGROUND

1. Field

Embodiments of the present disclosure relate to a light-emitting device package for back light and a manufacturing method thereof, and more particularly, to a light-emitting device package for back light that may be used for display or lighting purposes and a manufacturing method thereof.

2. Description of the Related Art

A light-emitting diode (LED) refers to a type of semiconductor device capable of realizing light of various colors by forming a light-emitting source by forming a PN diode of a compound semiconductor. Such a light-emitting device has a long lifespan, may be miniaturized and lightweight, and may be driven at a low voltage. In addition, these LEDs are strong against shock and vibration, do not require warm-up time and complicated driving, and may be packaged after being mounted on a substrate or lead frame in various forms, so they may be modularized for various purposes and applied to a back light unit or various lighting devices, etc.

In general, a method of manufacturing a light-emitting device package for packaging a light-emitting device consists of a process of mounting the light-emitting device on the lead frame, forming a reflective member, and then forming a light conversion member above the light-emitting device.

However, in the case of these conventional light-emitting device packages, size or thickness is relatively large, so products may not be miniaturized or ultra-thin.

In order to solve this problem, a chip scale package (CSP) process of mounting a plurality of light-emitting devices, forming an optical member at once, and then individualizing the package to enable miniaturization and ultra-thinness of the package is used.

On the other hand, in conventional light-emitting device packages applied to edge-type backlight units, which are an isotropic light-emitting type, color shading may occur between the light-emitting device packages because a directivity angle is narrow. In addition, in order to solve such color shading, when intervals of light-emitting device packages are reduced by increasing the number of light-emitting device packages as before, cost is increased.

SUMMARY

An object of the embodiments of the present disclosure for solving the above problems is to provide a light-emitting device package for back light capable of increasing a directivity angle and increasing light efficiency by exposing a side surface of a wavelength conversion member, and a manufacturing method thereof.

Additional aspects will be set forth in part in the description which follows and, in part, will be apparent from the description, or may be learned by practice of the presented embodiments.

An embodiment of the present disclosure provides a light-emitting device package includes an LED chip including a substrate having an upper surface, a semiconductor laminate structure formed under the substrate, and a first conductive connection pad and a second conductive connection pad formed under the semiconductor laminate structure, a wavelength conversion member having one surface in contact with the upper surface of the substrate, a light transmitting member covering a side surface of the LED chip and one surface of the wavelength conversion member adjacent to the side surface, and a reflector including at least one first region covering a side surface of the wavelength conversion member and the light transmitting member, and at least one second region covering the light transmitting member and exposing the side surface of the wavelength conversion member.

In one embodiment of the present disclosure, the second region of the reflector may be formed at positions corresponding to two side surfaces facing each other among the four side surfaces of the wavelength conversion member.

In one embodiment of the present disclosure, the second region of the reflector may be formed at positions corresponding to three side surfaces of the four side surfaces of the wavelength conversion member.

In one embodiment of the present disclosure, one surface of the light transmitting member connecting the side surface of the LED chip and the one surface of the wavelength conversion member may be formed in a curved surface.

In one embodiment of the present disclosure, the one surface of the light transmitting member may be concave toward the LED chip and the wavelength conversion member.

In one embodiment of the present disclosure, a width of the wavelength conversion member may be greater than a width of the LED chip.

In one embodiment of the present disclosure, a width of the reflector corresponding to the second region may be the same as a width of a portion of the wavelength conversion member which protrudes from the LED chip.

In one embodiment of the present disclosure, a width of the reflector corresponding to the first region may be greater than a width of a portion of the wavelength conversion member which protrudes from the LED chip.

Another embodiment of the present disclosure provides a light-emitting device package including an LED chip including a semiconductor laminate structure, a substrate formed above of the semiconductor laminate structure, and a first conductive connection pad and a second conductive connection pad formed under the semiconductor laminate structure, a wavelength conversion member disposed above the substrate, a light transmitting member covering at least one side surface of the LED chip, and a reflector formed on a side surface of the light transmitting member, wherein the reflector is disposed to surround the side surface of the LED chip and side surfaces of the wavelength conversion member and the light transmitting member, and exposes at least one side surface of the wavelength conversion member.

In one embodiment of the present disclosure, one surface of the light transmitting member connecting the at least one side surface of the LED chip and one surface of the wavelength conversion member may be formed as a curved surface.

In one embodiment of the present disclosure, the one surface of the light transmitting member may be concave toward the LED chip and the wavelength conversion member.

In one embodiment of the present disclosure, the light transmitting member may be arranged to cover all side surfaces of the LED chip and one surface of the wavelength conversion member adjacent to the side surface.

In one embodiment of the present disclosure, a width of the wavelength conversion member may be greater than a width of the LED chip.

In one embodiment of the present disclosure, a width of the reflector corresponding to the exposed side surface of the wavelength conversion member may be the same as a width of a portion of the wavelength conversion member which protrudes from the LED chip.

An embodiment of the present disclosure provides a method of manufacturing a light-emitting device package including preparing a plurality of LED chips including a substrate having an upper surface, a semiconductor laminate structure formed under the substrate, and a first conductive connection pad and a second conductive connection pad formed under the semiconductor laminate structure, arranging upper surfaces of the plurality of LED chips on a wavelength conversion sheet, forming a light transmitting member between a side surface of the LED chip and one surface of the wavelength conversion member adjacent to the side surface, cutting the wavelength conversion sheet between the plurality of LED chips to form a plurality of wavelength conversion members arranged at predetermined intervals, and forming a reflector including a first region covering a side surface of the wavelength conversion member and the light transmitting member and a second region covering the light transmitting member and exposing a side surface of the wavelength conversion member.

In one embodiment of the present disclosure, forming the reflector may include filling a reflective material between the plurality of LED chips and the plurality of wavelength conversion members, cutting the wavelength conversion member and the reflector to form the first region, and cutting the reflector to form the second region.

In one embodiment of the present disclosure, a width of the wavelength conversion member may be greater than a width of the LED chip.

In one embodiment of the present disclosure, a width of the reflector corresponding to the second region may be the same as a width of a portion of the wavelength conversion member which protrudes from the LED chip.

In one embodiment of the present disclosure, the wavelength conversion sheet may be formed on a temporary support sheet, and the temporary support sheet may be removed after forming the reflector.

In one embodiment of the present disclosure, one surface of the light transmitting member connecting the side surface of the LED chip and the one surface of the wavelength conversion member may be formed in a curved surface.

Other aspects, features and advantages other than those described above will become apparent from the following detailed description of the drawings, claims and disclosure.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
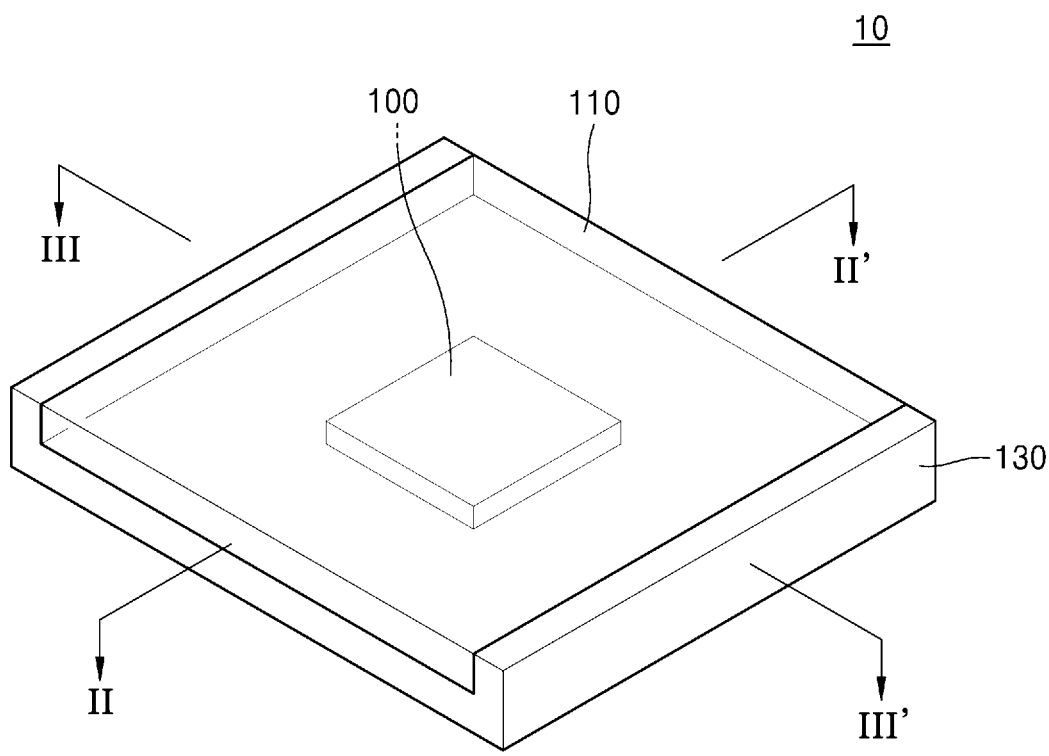
FIG. 1 is a diagram schematically illustrating a light-emitting device package according to an embodiment of the present disclosure.

Hereinafter, the following embodiments will be described in detail with reference to the accompanying drawings, and when described with reference to the drawings, the same or corresponding components are given the same reference numerals, and the overlapping description thereof will be omitted.

Since the present embodiments can apply various transformations, specific embodiments are illustrated in the drawings and described in detail in the detailed description. Effects and features of the present embodiments, and a method of achieving them will become clear with reference to the details described later in conjunction with the drawings. However, the present embodiments are not limited to the embodiments disclosed below and may be implemented in various forms.

In the following embodiments, terms such as first, second, etc. are used for the purpose of distinguishing one component from other components without limiting meaning.

In the following examples, the singular expression includes the plural expression unless the context clearly dictates otherwise.

In the following embodiments, terms such as include or have means that the features or components described in the specification are present, and the possibility that one or more other features or components will be added is not excluded in advance.

In the following embodiments, when it is said that a part such as a unit, region, or component is on or on another part, it is not only when it is directly on the other part, but also another unit, region, component, etc. is interposed therebetween. cases are included.

In the following embodiments, terms such as connect or couple do not necessarily mean direct and/or fixed connection or coupling of two members unless the context clearly indicates otherwise, and does not exclude that another member is interposed between the two members.

It means that a feature or element described in the specification is present, and does not preclude the possibility that one or more other features or elements may be added.

In the drawings, the size of the components may be exaggerated or reduced for convenience of description. For example, since the size and thickness of each component shown in the drawings are arbitrarily indicated for convenience of description, the following embodiment is not necessarily limited to the illustrated bar.

Figure 2:
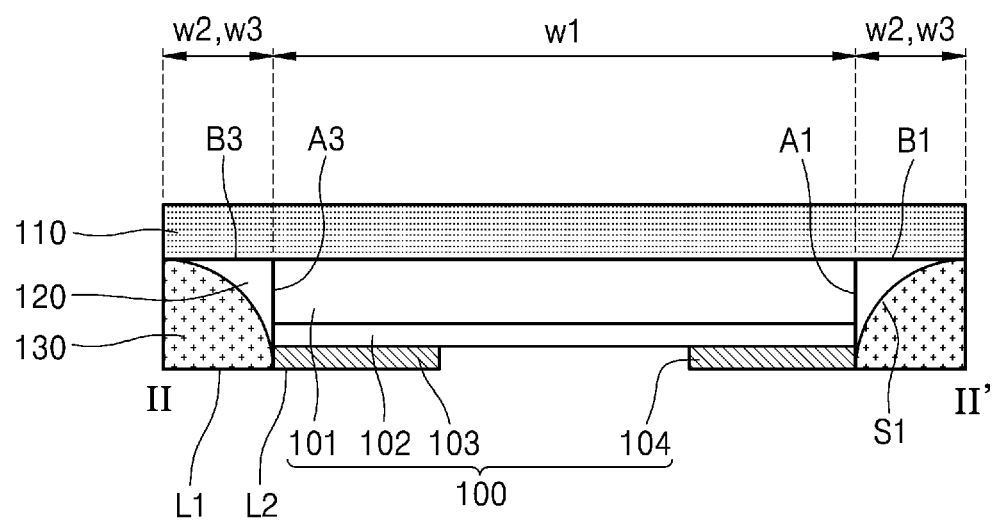
FIG. 2 is a cross-sectional view taken along line II-II' of FIG. 1.
Figure 3:
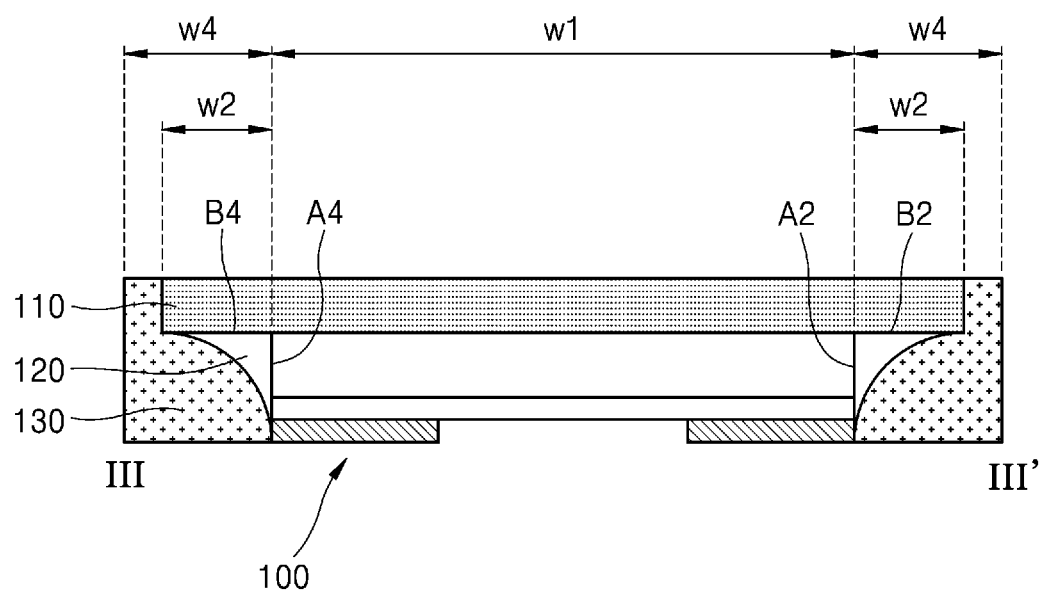
FIG. 3 is a cross-sectional view taken along line III-III' of FIG. 1.

FIG. 1 is a diagram schematically illustrating a light-emitting device package according to an embodiment of the present disclosure, FIG. 2 is a cross-sectional view taken along line II-II' of FIG. 1, and FIG. 3 is a cross-sectional view taken along line III-III' of FIG. 1.

Referring to FIGS. 1 to 3, a light-emitting device package 10 may include an LED chip 100, a wavelength conversion member 110, a light transmitting member 120 and a reflector 130.

The LED chip 100 may include a substrate 101, a semiconductor laminate structure 102, a first conductive connection pad 103 and a second conductive connection pad 104.

The substrate 101 may be a sapphire substrate including a light-emitting surface.

The semiconductor laminate structure 102 may be a gallium nitride-based semiconductor laminate structure formed on the substrate 101. The semiconductor laminate structure 102 includes a first conductive semiconductor layer, an active layer and a second conductive semiconductor layer. At this time, although illustrated briefly in the drawings, a part of the second conductive semiconductor layer and the active layer are selectively removed, so that a part of the first conductive semiconductor layer is exposed, and the first conductive connection pad 103 may be connected through the exposed area. In addition, the second conductive connection pad 104 is connected to the second conductive semiconductor layer.

The wavelength conversion member 110 may be disposed above the LED chip 100, specifically, above the substrate 101. The wavelength conversion member 110 may be formed of a fluorescent sheet including a fluorescent substance. However, the present disclosure is not limited thereto, and the wavelength conversion member 110 may be formed by a mixture of one or more fluorescent substances and an encapsulant made of, for example, a resin powder on a temporary support sheet to be described later.

The LED chip 100 is preferably a blue LED chip, and the wavelength conversion member 110 may include a red fluorescent substance that emits red light when excited by blue light and a green fluorescent substance that emits green light, or may include a yellow fluorescent substance that emits yellow light when excited by blue light.

The wavelength conversion member 110 may cover an upper surface of the substrate 101. In this case, a width of the wavelength conversion member 110 may be greater than a width w1 of the LED chip 100. That is, one surface of the wavelength conversion member 110 may have a larger area than the LED chip 100 and may cover the upper surface of the LED chip 100.

The light transmitting member 120 may cover at least one side surface A1 and A3 of the LED chip 100 and one surface B1 and B3 of the wavelength conversion member 110 adjacent to the side surface A1 and A3. The light transmitting member 120 may be made of a silicon material having transparency. The light transmitting member 120 may be formed to correspond to a portion to be exposed. As an embodiment, the light transmitting member 120 covers only one side surface A1 and A3 of the LED chip 100 and one surface B1 and B3 of the wavelength conversion member 110 adjacent to one side surface A1 and A3, may not be formed on the other side surface A2 and A4 of the LED chip 100 which is not exposed and the other surface B2 and B4 of the wavelength conversion member 110 adjacent to the other side surface A2 and A4.

As another embodiment, the light transmitting member 120 may be disposed to cover all side surfaces A1, A2, A3 and A4 of the LED chip 100 and one surface B1, B2, B3 and B4 of the wavelength conversion member 110 adjacent to the side surfaces A1, A2, A3 and A4. Hereinafter, for convenience of description, a case in which the light transmitting member 120 is disposed on all side surfaces A1, A2, A3 and A4 of the LED chip 100 will be mainly described.

One surface S1 of the light transmitting member 120 that connects the side surfaces A1, A2, A3 and A4 of the LED chip 100 and the one surface B1, B2, B3 and B4 of the wavelength conversion member 110 may be formed as a curved surface. The one surface S1 of the light transmitting member 120 may be concave toward the LED chip 100 and the wavelength conversion member 110.

The light transmitting member 120 may transmit light emitted from the side surfaces A1, A2, A3 and A4 of the LED chip 100 to the wavelength conversion member 110.

The reflector 130 is arranged to surround the side surface of the LED chip 100, the side surface of the wavelength conversion member 110, and the light transmitting member 120, but may expose at least one side surface of the wavelength conversion member 110.

The reflector 130 may be made of a reflective material that reflects the light emitted from the LED chip 100. In another embodiment, the reflector 130 may be made of an absorbing material that absorbs the light emitted from the LED chip 100. Hereinafter, for convenience of description, a case in which the reflector 130 is made of the reflective material will be mainly described.

A base material of the reflector 130 may be an organic or inorganic resin material. For example, the reflector 130 may contain the organic or inorganic resin material such as silicone, epoxy, heat-resistant resin polyimide, phenol resin, melamine resin, unsaturated polyester resin, tritans, and the like.

The reflective material may be a material that reflects light using titanium dioxide ($TiO_2$), barium sulfate ($BaSO_4$), and the like. In addition, the reflector 130 may further include boron nitride (BN), aluminum nitride (AlN), aluminum (Al), graphite, and the like. Through this, the light transmitting member 120 may improve heat dissipation performance.

The reflector 130 may include a first region covering the side surface of the wavelength conversion member 110 and the light transmitting member 120 and a second region covering the light transmitting member 120 and exposing the side surface of the wavelength conversion member. In other words, the first region may become a non-luminous region because the side surface of the wavelength conversion member 110 is covered with the reflector 130, and the second region may become a luminous region because the side surface of the wavelength conversion member 110 is exposed.

In this case, a width w3 of the reflector 130 corresponding to the second region may be the same as a width w2 of a portion in which the wavelength conversion member 110 protrudes from the LED chip 100. Alternatively, a width w4 of the reflector 130 corresponding to the first region may be greater than the width w2 of the portion where the wavelength conversion member 110 protrudes from the LED chip 100.

Meanwhile, the reflector 130 may be formed to cover the side surfaces of the first conductive connection pad 130 and the second conductive connection pad 104 of the LED chip 100. In other words, a bottom surface L1 of the reflector 130 may be disposed on the same plane as bottom surfaces L2 of the first conductive connection pad 103 and the second conductive connection pad 104 of the LED chip 100.

Figure 4:
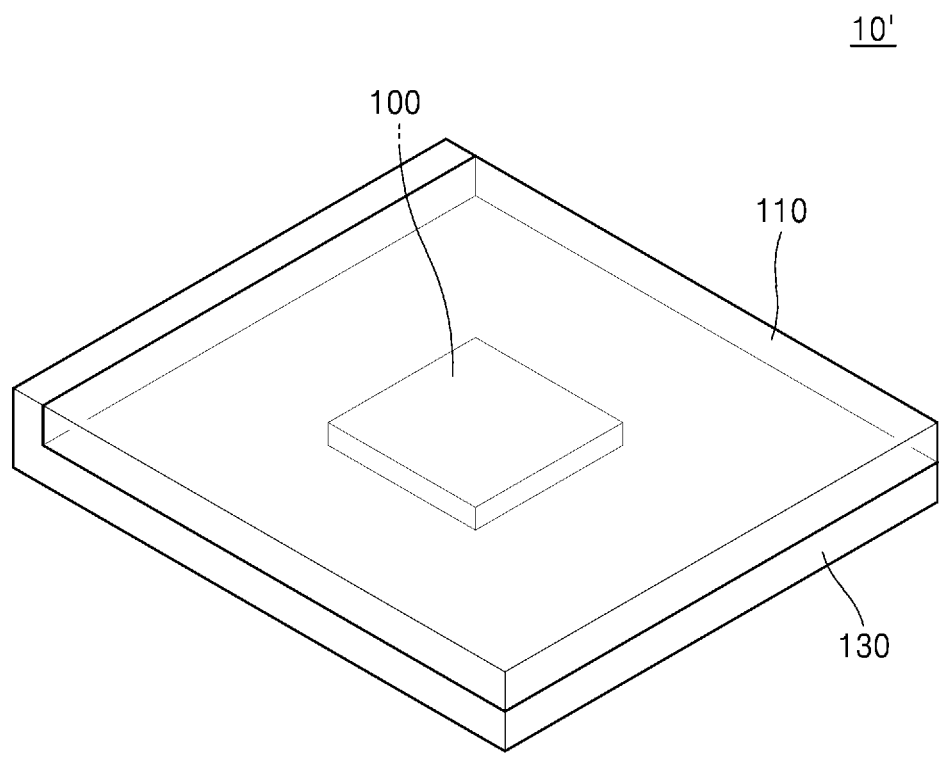
FIGS. 4 and 5 are diagrams schematically illustrating various embodiments of a light-emitting device package according to an embodiment of the present disclosure.
Figure 5:
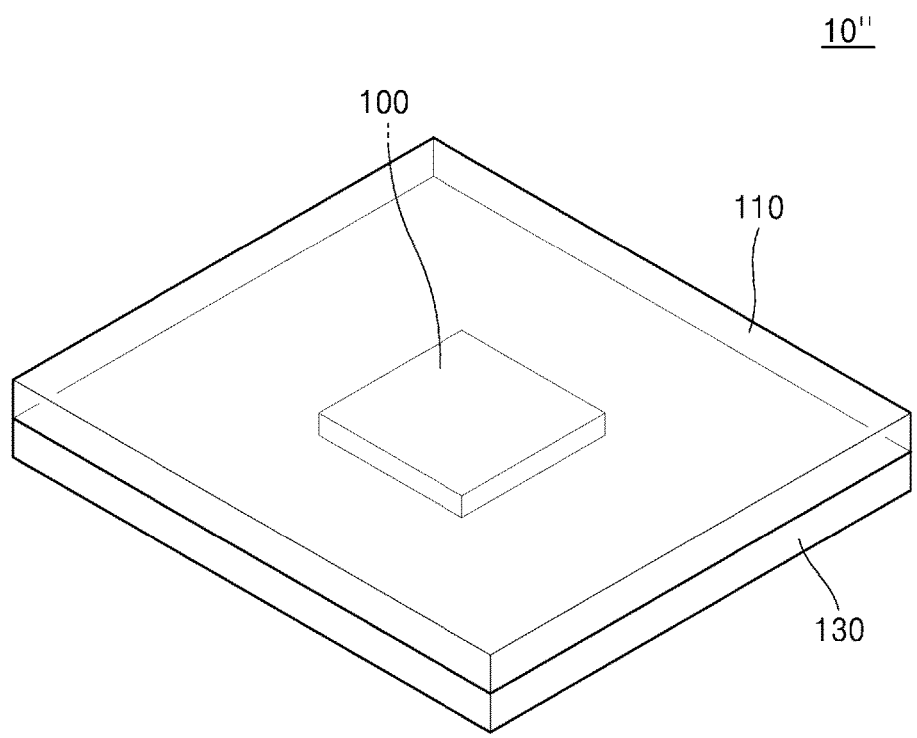

FIGS. 4 and 5 are diagrams schematically illustrating various embodiments of a light-emitting device package 10' and 10" according to an embodiment of the present disclosure.

The light-emitting device package 10, 10' and 10" according to one embodiment of the present disclosure exposes the side surface of the wavelength conversion member 110 through the structure of the reflector 130, so that the other surface than the upper surface of the LED chip 100 may be extended to a light-emitting surface.

As an embodiment, as illustrated in FIG. 1, the second region of the reflector 130 is formed at positions corresponding to two side surfaces facing each other among the four side surfaces of the wavelength conversion member, so that the light-emitting device package 10 may be emitted from three surfaces through the upper surface and the two side surfaces.

As another embodiment, as illustrated in FIG. 4, the second region of the reflector 130 is formed at positions corresponding to three side surfaces among the four side surfaces of the wavelength conversion member, so that the light-emitting device package 10' may be emitted from four surfaces through the upper surface and the three side surfaces.

As another embodiment, as illustrated in FIG. 5, the second region of the reflector 130 is formed at positions corresponding to all four side surfaces of the wavelength conversion member, so that the light-emitting device package 10" may be emitted from five surfaces through the upper surface and the four side surfaces.

In addition, although not illustrated, the second region of the reflector 130 is formed at a position corresponding to one side surface among the four side surfaces of the wavelength conversion member, so that the light-emitting device package 10 may be emitted from two surfaces through the upper surface and the one side surface.

The light-emitting device package according to the embodiments of the present disclosure having the above structure exposes the side surface of the wavelength conversion member, so that the directivity angle may be expanded to the exposed area, the amount of light may be increased, and various directivity characteristics may be provided by selecting the exposed surface as necessary.

FIGS. 6 to 11 are views for explaining a method of manufacturing a light-emitting device package according to an embodiment of the present disclosure.

Figure 6:
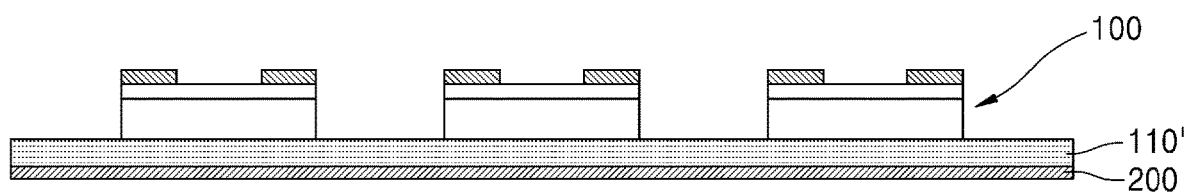
FIGS. 6 to 11 are views for explaining a method of manufacturing a light-emitting device package according to an embodiment of the present disclosure.

Referring to FIG. 6, in a method of manufacturing the light-emitting device package according to one embodiment of the present disclosure, first, a plurality of LED chips 100 including the substrate including the upper surface, the semiconductor laminate structure formed under the substrate, and the first conductive connection pad and the second conductive connection pad formed under the semiconductor laminate structure are prepared.

In this case, the upper surface of the plurality of LED chips 100 may be arranged to contact a wavelength conversion sheet 110'. The plurality of LED chips 100 may be arranged on the wavelength conversion sheet 110' at regular intervals.

The wavelength conversion sheet 110' may be formed on a temporary support sheet 200. The wavelength conversion sheet 110' may be composed of the fluorescent sheet containing the fluorescent substance. Alternatively, the wavelength conversion member 110 may be formed by the mixture of one or more fluorescent substances and the encapsulant composed of, for example, resin powder on the temporary support sheet 200.

Figure 7:
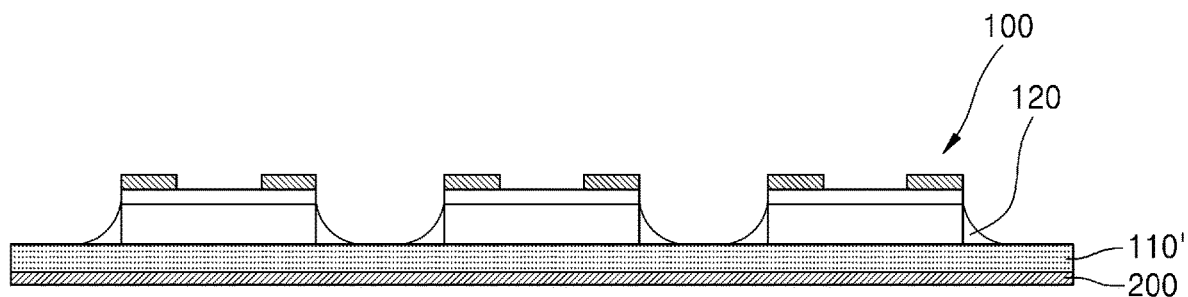

Referring to FIG. 7, the light transmitting member 120 is formed between the side surface of the LED chip 100 and the one surface of the wavelength conversion member 110 adjacent to the side surface. The light transmitting member 120 may be made of the silicon material having transparency, and may be formed between the LED chip 100 and the wavelength conversion member 110 by an injection method.

The light transmitting member 120 may be formed only at a position corresponding to the side surface to be exposed among the side surfaces of the wavelength conversion member 110, and may be formed to surround all side surfaces of the wavelength conversion member 110.

Figure 8:
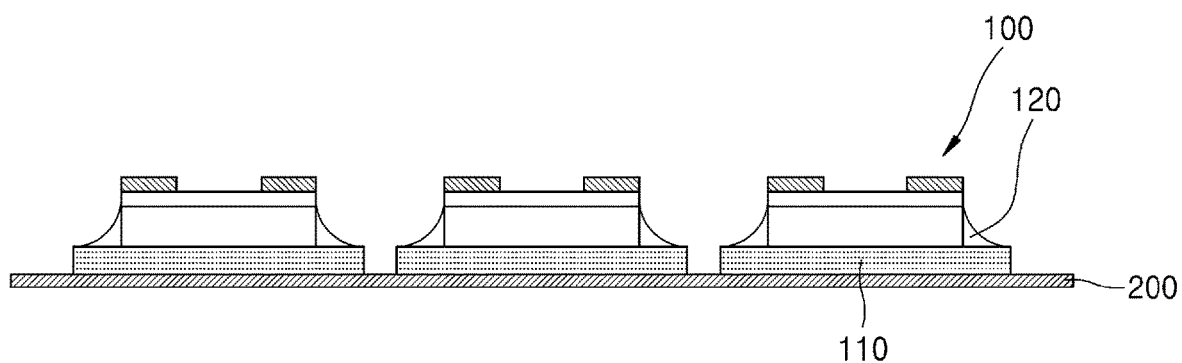

Referring to FIG. 8, the wavelength conversion sheet 110' between the plurality of LED chips 100 may be cut to form the plurality of wavelength conversion members 110 arranged at a predetermined interval. The wavelength conversion member 110 may have the width greater than the width of the LED chip 100.

Figure 9:
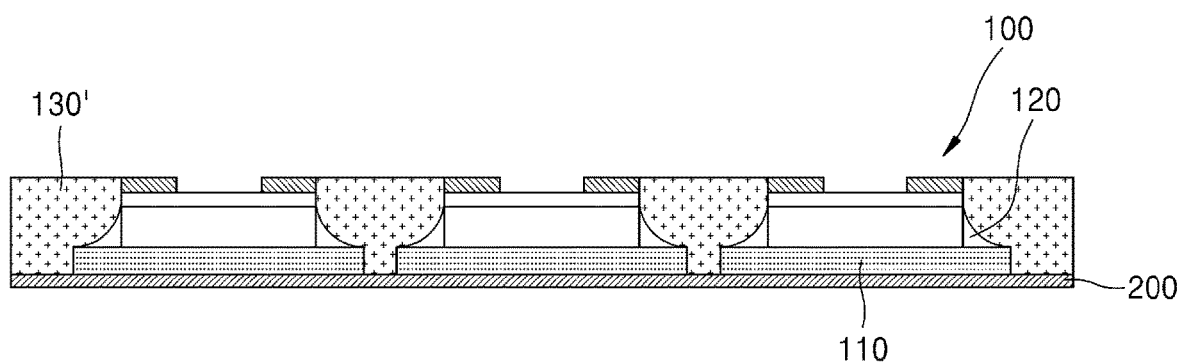

Referring to FIG. 9, the reflective material may be filled between the plurality of LED chips 100 and the plurality of wavelength conversion members 110. As illustrated in FIG. 9, the reflective material 130 is filled between the plurality of LED chips 100, and may be filled up to the side surfaces of the first conductive connection pad and the second conductive connection pad.

Figure 10A:
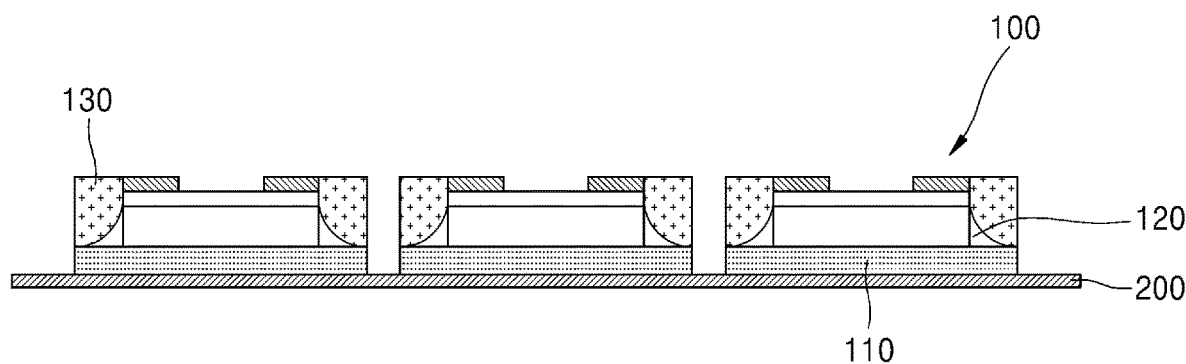
Figure 10B:
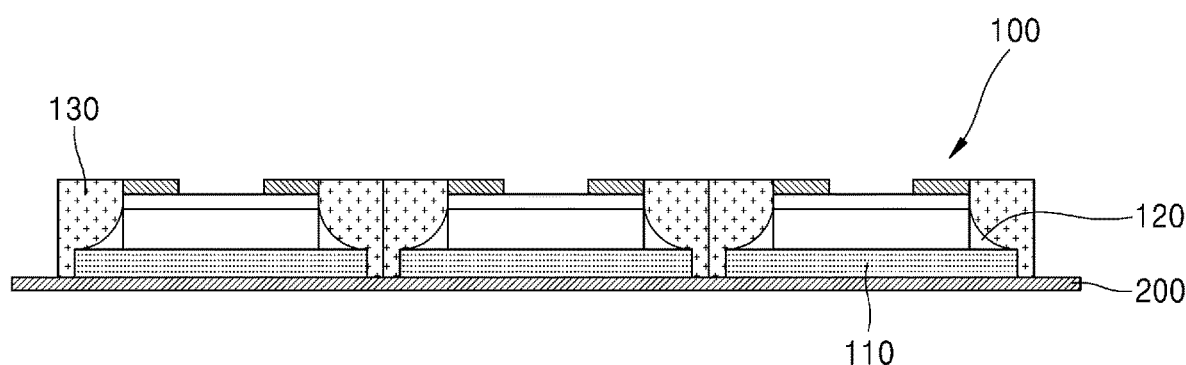

Referring to FIGS. 10A and 10B, the plurality of wavelength conversion members 110 may be cut to form the first region and the second region. FIG. 10A is a view for explaining the formation of the second region, and the second region may be formed by removing all of the reflective material between the wavelength conversion members 110. In other words, since the reflective material is all removed for the intervals of the plurality of wavelength conversion members 110, the reflector 130 may expose the side surface of the wavelength conversion member 110 thereafter. The width w3 of the reflector 130 corresponding to the second region may be the same as the width w2 of the portion in which the wavelength conversion member 110 protrudes from the LED chip 100 (see FIG. 2).

FIG. 10B is a view for explaining the formation of the first region, the first region may be formed by cutting between wavelength conversion members 110. Unlike the second region, in the first region, not all of the reflective material is removed, but the reflective material covering the side surface of the wavelength conversion member 110 may be left by being cut only at a predetermined interval.

Through this method of manufacturing the light-emitting device package, the reflector including the first region covering the side surface of the wavelength conversion member 110 and the light transmitting member 120 and the second region covering the light transmitting member and exposing the side surface of the wavelength conversion member may be formed.

Figure 11:
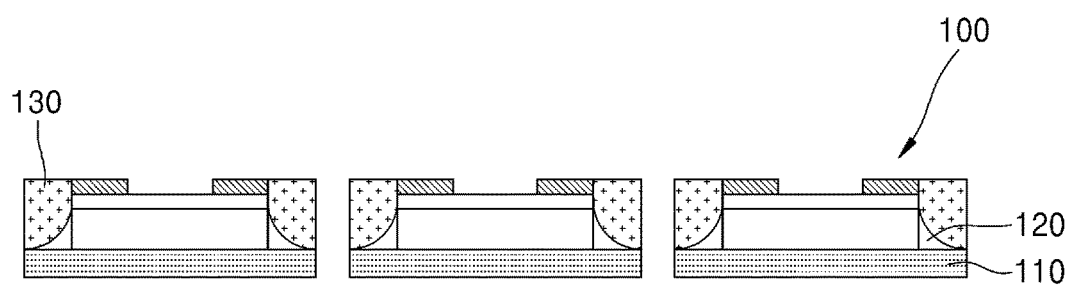

Thereafter, as illustrated in FIG. 11, the temporary support sheet 200 is removed, so that the plurality of LED chips may be individually separated.

As described above, the method of manufacturing the light-emitting device package according to an embodiment of the present disclosure may manufacture a multi-faceted light-emitting device while simplifying a manufacturing process and reducing costs.

The light-emitting device package according to the embodiments of the present disclosure exposes the side surface of the wavelength conversion member, so that the directivity angle may be expanded to the exposed area, the amount of light may be increased, and various directivity characteristics may be provided by selecting the exposed surface as necessary.

The method of manufacturing the light-emitting device package according to embodiments of the present disclosure may manufacture the multi-faceted light-emitting device while simplifying a manufacturing process and reducing costs.

As such, the present disclosure has been described with reference to one embodiment shown in the drawings, but this is merely exemplary, and those of ordinary skill in the art will understand that various modifications and variations of the embodiments are possible therefrom. Accordingly, the true technical protection scope of the present disclosure should be determined by the technical spirit of the appended claims.

What is claimed is:

1. A method of manufacturing a light-emitting device package comprising:
    preparing a plurality of LED chips comprising a substrate having an upper surface, a semiconductor laminate structure formed under the substrate, and a first conductive connection pad and a second conductive connection pad formed under the semiconductor laminate structure;
    forming a wavelength conversion sheet directly on an upper surface of a temporary support sheet from a mixture comprising a fluorescent substance and an encapsulant;
    arranging upper surfaces of the plurality of LED chips on the wavelength conversion sheet;
    forming a light transmitting member between a side surface of each of the plurality of LED chips and one surface of the wavelength conversion sheet adjacent to the side surfaces of the plurality of LED chips by an injection method;
    cutting the wavelength conversion sheet between the plurality of LED chips to form a plurality of wavelength conversion members arranged at predetermined intervals on the temporary support sheet;
    filling a reflective material between the plurality of LED chips and the plurality of wavelength conversion members;
    forming a reflector comprising
        a first region covering a side surface of each of the wavelength conversion members and the light transmitting member and
        a second region covering the light transmitting member and exposing the side surface of each of the wavelength conversion members; and
    after forming the reflective material, removing the temporary support sheet by which the plurality of LED chips are individually separated,
    wherein the maximum height of the filled reflective material corresponds to a distance between the upper surface of the temporary support sheet and the exposed surfaces of the first and second conductive connection pads formed on the LED chips, and
    wherein forming the reflector comprises:
        cutting the wavelength conversion members to form the first regions of the reflective material that cover the side surfaces of the wavelength conversion members and the light transmitting members; and
        removing portions of the reflective material between the wavelength conversion members that do not form the first regions to create the second regions that cover the light transmitting members and expose the side surfaces of the wavelength conversion members.

2. The method of claim 1, wherein a width of each of the plurality of wavelength conversion members is greater than a width of a corresponding LED chip selected from the plurality of LED chips.

3. The method of claim 1, wherein a width of the reflector corresponding to the second region is the same as a width of a portion of each of the plurality of wavelength conversion members which protrudes from a corresponding LED chip selected from the plurality of LED chips.

4. The method of claim 1, wherein one surface of the light transmitting member connecting the side surface of each of the plurality of LED chips and the one surface of a corresponding wavelength conversion member selected from the plurality of the wavelength conversion members is formed as a curved surface.

5. The method of claim 1, wherein one surface of the light transmitting member is a concave surface facing the LED chip and the wavelength conversion member.

6. The method of claim 1, wherein, when filling the reflective material, a portion of the semiconductor laminate structure between the first conductive connection pad and the second conductive connection pad is exposed without being covered by the reflective material.

7. A method of manufacturing a light-emitting device package comprising:
    forming a wavelength conversion sheet directly on a temporary support sheet;
    arranging a plurality of LED chips on the wavelength conversion sheet, each of the plurality of LED chips comprising a substrate, a semiconductor laminate structure, a first conductive connection pad, and a second conductive connection pad;
    after arranging the plurality of LED chips on the wavelength conversion sheet, injecting a light transmitting member between a side surface of each of the plurality of LED chips and the wavelength conversion sheet;
    cutting the wavelength conversion sheet to form a plurality of wavelength conversion members on the temporary support sheet at a predetermined interval;
    filling a reflective material between each of the plurality of LED chips and each of the plurality of wavelength conversion members to form a reflector comprising:
        a first region covering a side surface of each of the plurality of wavelength conversion members and the light transmitting member; and
        a second region covering the light transmitting member and exposing the side surface of each of the plurality of wavelength conversion members; and
    after forming the reflector, removing the temporary support sheet to individually separate the plurality of LED chips,
    wherein the maximum height of the reflector is the same as a distance between the upper surface of the temporary support sheet and the exposed surfaces of the first and second conductive connection pads of the LED chips, and
    wherein filling the reflective material further comprises:
        cutting the plurality of wavelength conversion members to form the first region that covers the side surface of each of the plurality of wavelength conversion members and the light transmitting member; and
        removing portions of the reflective material between the wavelength conversion member that does not form the first region to form the second region that covers the light transmitting member and exposes the side surface of each of the plurality of wavelength conversion members.

8. The method of claim 7, wherein a width of each of the plurality of wavelength conversion members is greater than a width of a corresponding LED chip selected from the plurality of LED chips.

9. The method of claim 7, wherein a width of the reflector corresponding to the second region is the same as a width of a portion of each of the plurality of wavelength conversion members which protrudes from a corresponding LED chip selected from the plurality of LED chips.

10. The method of claim 7, wherein each of the light transmitting members connecting each of the plurality of LED chips and each of the wavelength conversion members comprises a curved surface.

11. The method of claim 7, wherein each of the light transmitting members comprises a concave surface.

12. The method of claim 7, wherein filling the reflective material comprises exposing a portion of the semiconductor laminate structure between the first conductive connection pad and the second conductive connection pad from the reflective material.

13. The method of claim 7, wherein the wavelength conversion sheet is formed on the temporary support sheet from a mixture comprising a fluorescent substance and an encapsulant.

* * * * *